(12) United States Patent
Park et al.

(10) Patent No.: US 10,476,032 B2
(45) Date of Patent: Nov. 12, 2019

(54) DISPLAY DEVICE AND METHOD OF MANUFACTURING THE SAME

(71) Applicant: SAMSUNG DISPLAY CO., LTD., Yongin-si, Gyeonggi-Do (KR)

(72) Inventors: Gyung Soon Park, Yongin-si (KR); Sang Woo Kim, Yongin-si (KR); Il Joo Kim, Yongin-si (KR); Jae Min Shin, Yongin-si (KR); Jun Ki Jeong, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/239,920

(22) Filed: Jan. 4, 2019

(65) Prior Publication Data

US 2019/0214600 A1    Jul. 11, 2019

(30) Foreign Application Priority Data

Jan. 5, 2018    (KR) .................. 10-2018-0001916

(51) Int. Cl.
*H01J 1/62* (2006.01)
*H01L 51/52* (2006.01)
(Continued)

(52) U.S. Cl.
CPC ....... *H01L 51/5256* (2013.01); *G09G 3/3266* (2013.01); *G09G 3/3275* (2013.01);
(Continued)

(58) Field of Classification Search
None
See application file for complete search history.

(56) References Cited

U.S. PATENT DOCUMENTS 7,830,591 B2    11/2010   Shimodaira
7,915,821 B2 *   3/2011   Kang .................. H01L 27/3246
                                                         313/506
(Continued)

FOREIGN PATENT DOCUMENTS

KR    1020170019553    2/2017
KR    1020170059864    5/2017
(Continued)

*Primary Examiner* — Vip Patel
(74) *Attorney, Agent, or Firm* — F. Chau & Associates, LLC

(57) ABSTRACT

A display device includes a substrate including a display region, a first non-display region in the display region and a second non-display region outside the display region. A pixel array layer is disposed on the display region of the substrate. An encapsulation layer is disposed on the display region. The encapsulation layer is disposed on the first and second non-display regions of the substrate. The first non-display region includes a through hole penetrating the pixel array layer and the substrate. An encapsulation groove is spaced apart from the through hole. An inner wall of the through hole and an inner wall of the encapsulation groove are at least partially covered with the encapsulation layer. An end face of the encapsulation layer facing away from the pixel array layer has an irregular shape when viewed from a side of the substrate opposite the pixel array layer.

20 Claims, 13 Drawing Sheets

(51) Int. Cl.
*H01L 51/00* (2006.01)
*H01L 51/50* (2006.01)
*G09G 3/3266* (2016.01)
*G09G 3/3275* (2016.01)
*H01L 27/32* (2006.01)

(52) U.S. Cl.
CPC ...... *H01L 27/3276* (2013.01); *H01L 51/0097* (2013.01); *H01L 51/5012* (2013.01); *G09G 2310/08* (2013.01); *H01L 2227/323* (2013.01)

(56) References Cited

U.S. PATENT DOCUMENTS

| | | | | |
|---|---|---|---|---|
| 2010/0253225 | A1* | 10/2010 | Lifka | A61N 5/0616 315/112 |
| 2017/0047544 | A1 | 2/2017 | Kang et al. | |
| 2017/0148856 | A1 | 5/2017 | Choi et al. | |
| 2017/0162111 | A1 | 6/2017 | Kang et al. | |
| 2017/0162637 | A1 | 6/2017 | Choi et al. | |
| 2017/0294502 | A1* | 10/2017 | Ka | H01L 27/3248 |

FOREIGN PATENT DOCUMENTS

| | | |
|---|---|---|
| KR | 1020170065059 | 6/2017 |
| KR | 1020170066767 | 6/2018 |

\* cited by examiner

DISPLAY DEVICE AND METHOD OF MANUFACTURING THE SAME

CROSS-REFERENCE TO RELATED APPLICATION

The application claims priority under 35 U.S.C. § 119 to Korean Patent Application No. 10-2018-0001916, filed Jan. 5, 2018, the disclosure of which is incorporated by reference herein in its entirety.

TECHNICAL FIELD

Exemplary embodiments of the present invention relate to a display device, and more particularly to a method of manufacturing the same.

DISCUSSION OF RELATED ART

Display devices of a flat plate type may be relatively thin and light.

Display devices of the flat plate type may be flexible

SUMMARY

An exemplary embodiment of the present invention provides a display device having a through hole in a display region and a method of manufacturing the same.

An exemplary embodiment of the present invention provides capable of preventing an increase in dead space due to the formation of a through hole and a method of manufacturing the same.

An exemplary embodiment of the present invention provides a display device capable of preventing penetration of moisture or outside air through the through hole and a method of manufacturing the same.

According to an exemplary embodiment of the present invention, a display device includes a substrate including a display region, a first non-display region in the display region and a second non-display region outside the display region. A pixel array layer is disposed on the display region of the substrate. An encapsulation layer is disposed on the display region. The encapsulation layer is disposed on the first and second non-display regions of the substrate. The first non-display region includes a through hole penetrating the pixel array layer and the substrate. An encapsulation groove is spaced apart from the through hole. An inner wall of the through hole and an inner wall of the encapsulation groove are at least partially covered with the encapsulation layer. An end face of the encapsulation layer facing away from the pixel array layer has an irregular shape when viewed from a side of the substrate opposite the pixel array layer.

The substrate may be a flexible substrate.

The pixel array layer may include a pixel array in which a plurality of pixels are connected between a plurality of scan lines and a plurality of data lines. Each of the plurality of pixels may include a light emitting element and at least one transistor.

The encapsulation groove may include a plurality of slits and inner walls of each of the plurality of slits may be at least partially covered with the encapsulation layer. Widths and depths of the plurality of slits may be increased as the distance from the display region increases.

The encapsulation layer may include a first inorganic encapsulation layer, an organic encapsulation layer and a second inorganic encapsulation layer. The inner wall of the through hole may be in direct contact with the first inorganic encapsulation layer.

The irregular shape may include a zigzag pattern.

According to an exemplary embodiment of the present invention, a method of manufacturing a display device includes providing a first substrate. The method includes providing a second substrate on the first substrate. The second substrate includes a display region, a first non-display region in the display region and a second non-display region outside the display region. The method includes forming a pixel array layer on the display region of the second substrate. The method includes forming a separation hole and an encapsulation groove in the first non-display region of the second substrate. The method includes forming an encapsulation layer on the display region and the first and second non-display regions of the second substrate. An inner wall of the separation hole and an inner wall of the encapsulation groove may be at least partially covered with the encapsulation layer. The method includes separating the first substrate from the second substrate. In the separating of the first substrate from the second substrate, the pixel array layer and the second substrate inside the separation hole are separated together with the first substrate, and a remaining through hole is formed in the second substrate. An end face of the encapsulation layer formed on the inner wall of the separation hole when the first substrate is separated from the second substrate has an irregular shape.

The first substrate may include glass, quartz, metal or plastic.

The second substrate may be a flexible substrate.

The second substrate may include a first organic layer, a first inorganic layer, a second organic layer and a second inorganic layer. The encapsulation layer may be formed to contact with the first and second inorganic layers on the inner wall of the separation hole and the inner wall of the encapsulation groove.

The encapsulation groove may be spaced apart from the separation hole.

The encapsulation groove may be formed to include a plurality of slits. The encapsulation layer may be formed to at least partially cover inner walls of the plurality of slits. The plurality of slits may be formed so that the widths and depths of each of the plurality of slits increase as a distance from the display region increases.

In the forming of the separation hole and the encapsulation groove, the separation hole may be formed to penetrate the pixel array layer and the second substrate, and the encapsulation groove may be formed to a predetermined depth of the second substrate through the pixel array layer.

The method may include forming an adhesive layer on the second substrate in an area corresponding to the through hole.

According to an exemplary embodiment of the present invention, a display device includes a first substrate and a second substrate including an organic layer and an inorganic layer disposed on the first substrate. An encapsulation groove is formed in the second substrate. The encapsulation groove includes a plurality of holes formed in the second substrate. A through hole penetrates the second substrate. The through hole has a greater depth than a depth of the encapsulation groove toward the first substrate. The through hole is spaced apart from the encapsulation groove. An encapsulation layer is formed on an inner sidewall of the encapsulation groove and on an inner sidewall of the through hole.

A lowermost level of the through hole may be aligned with an upper surface of the first substrate facing the second substrate.

An adhesive layer may be immediately adjacent to the through hole. The adhesive layer may be spaced apart from the encapsulation groove. The adhesive layer may be disposed between the first substrate and the second substrate.

The encapsulation layer may include at least one organic layer and at least one inorganic layer.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE ILLUSTRATED EMBODIMENTS

Figure 1:
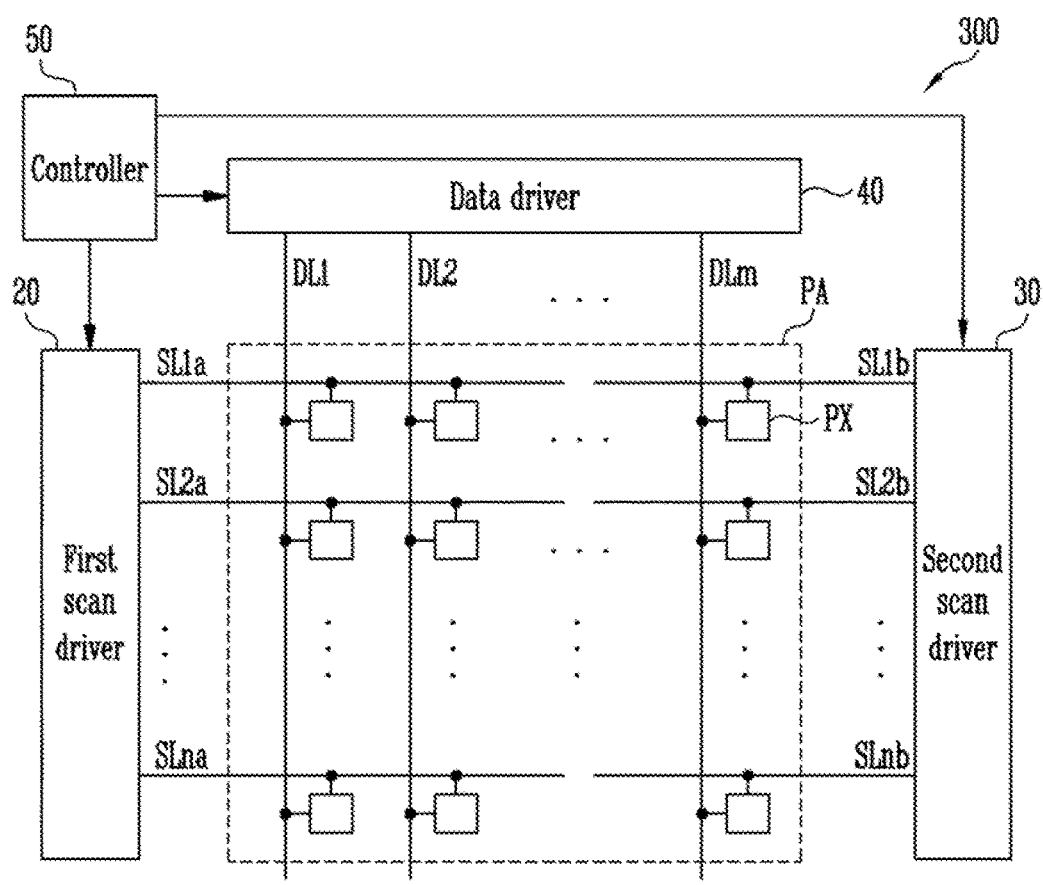
FIG. 1 is a schematic block diagram of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

It will be understood that although the terms "first" and "second" may be used herein to describe various components, these components should not be limited by these terms.

If an embodiment is otherwise feasible, the process sequence may be performed differently from the sequence described. For example, two processes that are performed in succession may be performed substantially simultaneously, or may be performed in the reverse order to that described.

It will be understood that when an element such as a region, layer, or portion is referred to as being "on" another element, it may be directly on the other element or intervening elements may also be present.

Sizes of elements or layers in the drawings may be exaggerated for clarity of description.

FIG. 1 is a schematic block diagram of a display device according to an exemplary embodiment of the present invention.

Referring to FIG. 1, a display device 300 may include a pixel array PA, a first scan driver 20, a second scan driver 30, a data driver 40 and a controller 50.

The pixel array PA includes a plurality of pixels PX. Each pixel PX may include a light emitting element and a pixel circuit to operate the light emitting element.

The light emitting element may include an organic light emitting diode OLED. The pixel circuit may include at least one transistor to transfer a signal to the light emitting element and a capacitor for maintaining the signal.

The pixel array PA may include a plurality of scan lines SL1a to SLna and SL1b to SLnb and a plurality of data lines DL1 to DLm. The plurality of pixels PX may be arranged in an approximate matrix form at intersections of the plurality of scan lines SL1a to SLna and SL1b to SLnb and the plurality of data lines DL1 to DLm.

The plurality of scan lines SL1a to SLna and SL1b to SLnb may extend in a first direction (e.g., a row direction), and the plurality of data lines DL1 to DLm may extend in a second direction (e.g., a column direction). The second direction may be perpendicular to the first direction.

Each pixel PX may be connected to one of the plurality of scan lines SL1a to SLna and SL1b to SLnb. Referring to FIG. 1, each pixel PX may be connected to one scan line corresponding to each pixel row; however, exemplary embodiments of the present invention are not limited thereto. As an example, each pixel PX may be connected to two scan lines.

The first scan driver 20 and the second scan driver 30 may be disposed on opposite sides of the pixel array PA, and may provide scan signals to the pixel array PA in a dual scanning method. For example, the first scan driver 20 may provide scan signals to a part of the plurality of pixels PX and the second scan driver 30 may provide scan signals to the remaining part of the plurality of pixels PX.

The first scan driver 20 and the second scan driver 30 may be synchronized by a synchronized clock signal.

The data driver 40 may provide data signals to the respective pixels PX through the plurality of data lines DL1 to DLm.

The controller 50 may receive an image signal from the outside, generate the data signals, and provide the data signals to the data driver 40. The controller 50 may receive a synchronization signal and a clock signal from the outside, generate a control signal, and provide the control signal to the first and second scan drivers 20 and 30 and the data driver 40.

The current flowing through the light emitting elements may be controlled by the data signals provided through the data lines DL1 to DLm, and thus each pixel PA may emit light of a predetermined luminance corresponding to the data signal.

Figure 2:
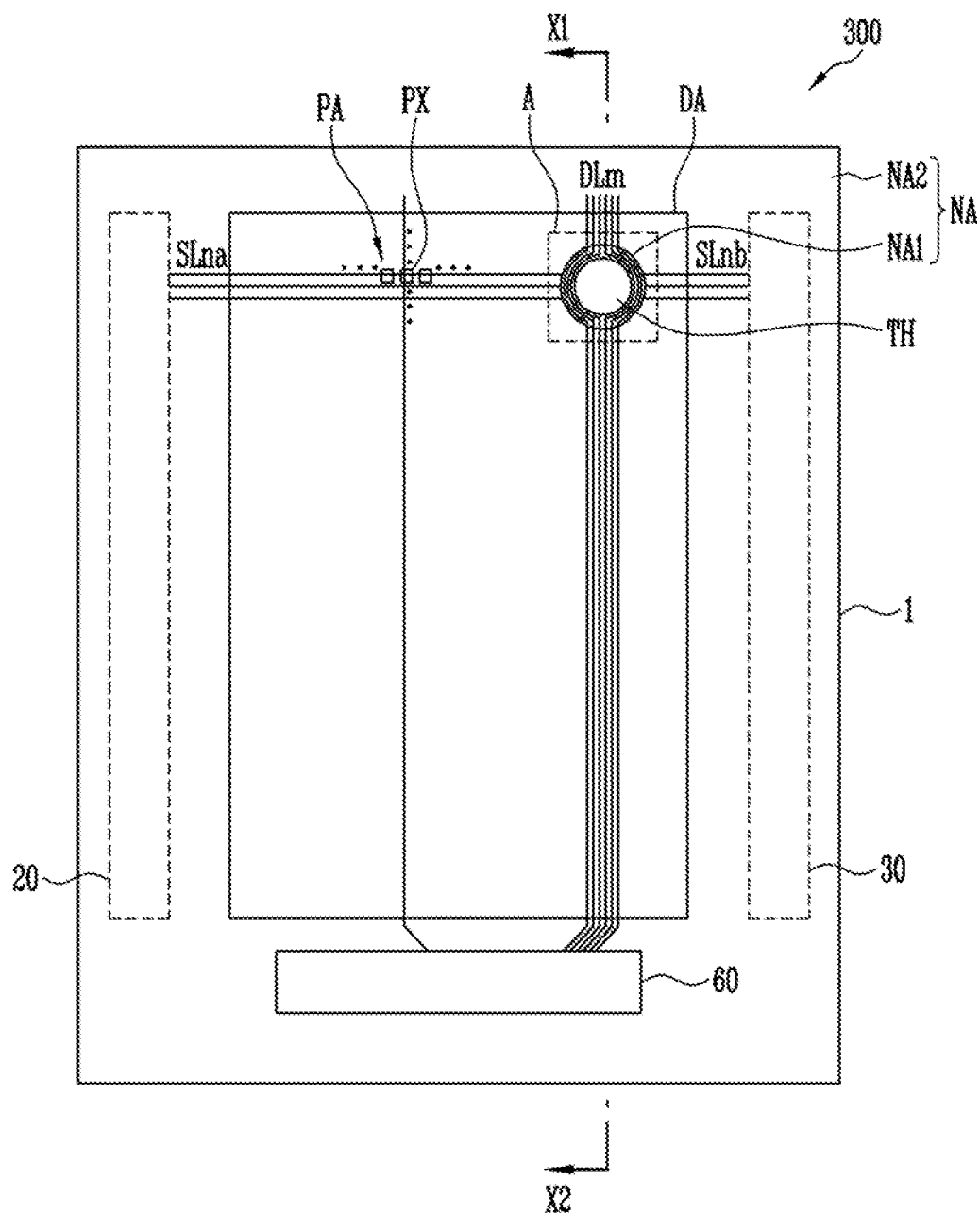
FIG. 2 is a schematic plan view of a display device according to an exemplary embodiment of the present invention.

FIG. 2 is a schematic plan view of a display device according to an exemplary embodiment of the present invention.

Referring to FIG. 2, a substrate 1 may include a display region DA and a non-display region NA.

The display region DA may be an area where the pixel array PA is located, and a predetermined image may be displayed by light emitted from the plurality of pixels PX.

The substrate 1 may include a through hole TH formed in the substrate 1. The through hole TH may penetrate entirely through the substrate 1 (e.g., along a direction orthogonal to an upper surface of the substrate 1). The through hole TH may be arranged so as to be surrounded by the plurality of pixels PX in the display region DA.

The non-display region NA may include a first non-display region NA1 and a second non-display region NA2.

The first non-display region NA1 may be disposed in the display region DA and may be defined as a predetermined region surrounding the peripheries of the through hole TH and the through hole TH. For example, the first non-display region NA1 may include the through hole TH and a region from the through hole TH to the adjacent pixel PX.

When the through hole TH is formed in the display region DA, some of the data lines DLm may overlap with the through hole TH. As an example, the data lines DLm may extend along a path overlapping the through hole TH, may be have a shape bypassing the through hole TH by curing around an outside of the though hole TH. Thus, the data lines DLm may partially overlap the through hole TH, or may extend along a periphery of the through hole TH. The data lines DLm overlapping the through hole TH may include a curved portion to pass along a perimeter of the through hole TH in the first non-display region NA1.

The second non-display region NA2 may at least partially surround the outer periphery of the display region DA. As an example, the second non-display region NA2 may be disposed on less than four sides of the display region DA when viewed in a plan view. For example, the second non-display region NA2 might be disposed on one side of the display region DA when viewed in a plan view. The first non-display region NA1 and the second non-display region NA2 may be separated from each other by the display region DA.

The first and second scan drivers 20 and 30 may be disposed in the second non-display region NA2. The first and second scan drivers 20 and 30 may be arranged to face each other with the display region DA therebetween.

The scan signals generated in the first scan driver 20 may be provided to some of the pixels PX through the scan lines Slia (i=1, 2, . . . , n) and the scan signals generated in the second scan driver 30 may be provided to some other pixels PX through the scan lines SLib (i=1, 2, . . . , n).

A pad unit 60 may be disposed in the second non-display region NA2. In the pad unit 60, for example, the data driver 40 may be mounted in the form of a semiconductor integrated circuit (IC) chip. The data signals generated in the data driver 40 may be provided to each pixel PX through the data lines DLm (m=1, 2, . . . ).

FIG. 2 illustrates an exemplary embodiment of the present invention in which the through hole TH is disposed in the peripheral portion of the display region DA; however, exemplary embodiments of the present invention are not limited thereto. For example, the through hole TH may be disposed at a center of the display region DA (e.g., when viewed in a plan view).

FIG. 2 illustrates an exemplary embodiment of the present invention in which the through hole TH is circular and one through hole TH is formed; however, exemplary embodiments of the present invention are not limited thereto. For example, the through hole TH may have various shapes such as a polygonal shape, for example, a quadrangle, or an ellipse, and the number of through holes TH is not limited to one. For example, two or more through holes TH may be formed in the display region DA.

FIG. 2 illustrates an exemplary embodiment of the present invention in which the first non-display region NA1 around the through hole TH is circular along the shape of the through hole TH; however, exemplary embodiments of the present invention are not limited thereto. For example, the first non-display region NA1 may have various shapes such as a polygonal shape, for example, a rectangle or an ellipse.

While the display region DA may be rectangular, exemplary embodiments of the present invention are not limited thereto. The display region DA may be a polygonal shape such as a triangle or a pentagon, or may have various shapes such as a circle or an ellipse.

Figure 3:
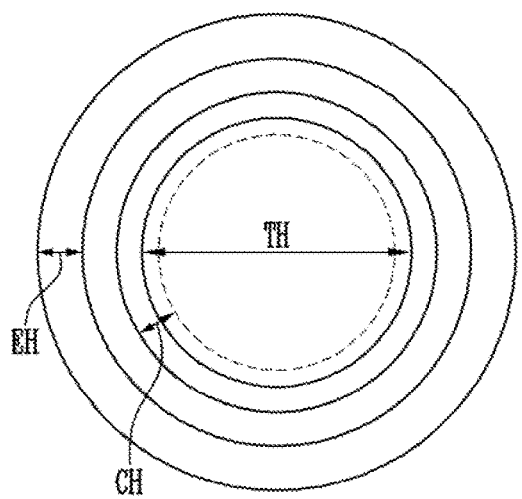
FIG. 3 is a schematic enlarged plan view of part A of FIG. 2.

FIG. 3 is a schematic enlarged plan view of part A of FIG. 2.

The through hole TH may include a hollow portion. For example, a central region of the through hole TH when viewed from above (e.g., in a plan view) might not be filled. The diameter of the through hole TH may be defined by a separation hole CH disposed outside (e.g., surrounding) the through hole TH. Thus, the separation hole CH may include the through hole TH, which may be defined inside the separation hole CH. Thus, the diameter of the separation hole CH may be larger than the diameter of the through hole TH.

An encapsulation groove EH may be spaced apart from the separation hole CH. For example, the encapsulation groove EH may be disposed at a predetermined distance from the separation hole CH. The through hole TH, the separation hole CH, and the encapsulation groove EH may be disposed in the first non-display region NA1 (see, e.g., FIG. 13 described in more detail below).

Figure 4:
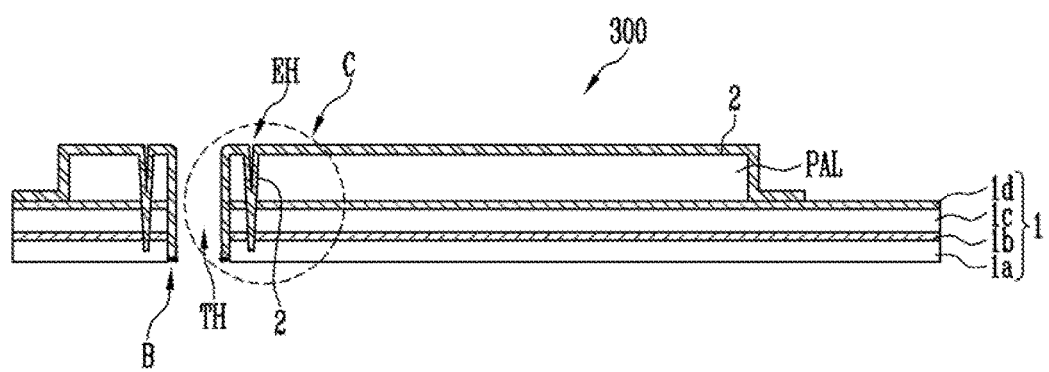
FIG. 4 is a cross-sectional view taken along line X1-X2 of FIG. 2.

FIG. 4 is a cross-sectional view taken along line X1-X2 of FIG. 2.

The display device 300 may include the substrate 1 including the display region DA, the first non-display region NA1 in the display region DA and the second non-display region NA2 outside the display region DA. A pixel array layer PAL may be arranged on the display region DA of the substrate 1. An encapsulation layer 2 may be formed on the display region DA and the first and second non-display regions NA1 and NA2. The encapsulation layer 2 may be disposed on the pixel array layer and may at least partially cover the pixel array layer PAL. The example, the encapsulation layer 2 may be disposed on upper and side surfaces of the pixel array layer PAL, and may be in direct contact with the upper and side surfaces of the pixel array layer PAL.

The pixel array layer PAL may include the pixel array PA, the plurality of scan lines SL1a to SLna and SL1b to SLnb, the plurality of data lines DL1 to DLm, and a power source line. The pixel array layer may include a gate insulating layer, a plurality of organic layers, a source and drain electrode, a gate electrode and a semiconductor layer (see, e.g., FIG. 13 described in more detail below).

The first non-display region NA1 may include the through hole TH passing through the pixel array layer PAL and the substrate 1, and the encapsulation groove EH may be spaced apart from the through hole TI. The inner walls of the through hole TH and the inner wall of the encapsulation groove EH may be at least partially covered with the encapsulation layer 2. The end face (e.g., portion B) of the encapsulation layer 2 on the inner wall of the through hole TH may have an irregular (e.g., a zigzag) shape when viewed from a side of the substrate 1 opposite the pixel array layer PAL. The irregular shape may be formed by cracks created when the substrate 1 is separated from an underlying layer (e.g., from another substrate). The irregular shape of the encapsulation layer 2 may face in a downward direction away from the pixel array layer PAL. Alternatively, the irregular shape of the encapsulation layer 2 may face toward an inside of the separation hole TH along a direction parallel to an upper surface of the substrate 1.

Figure 5:
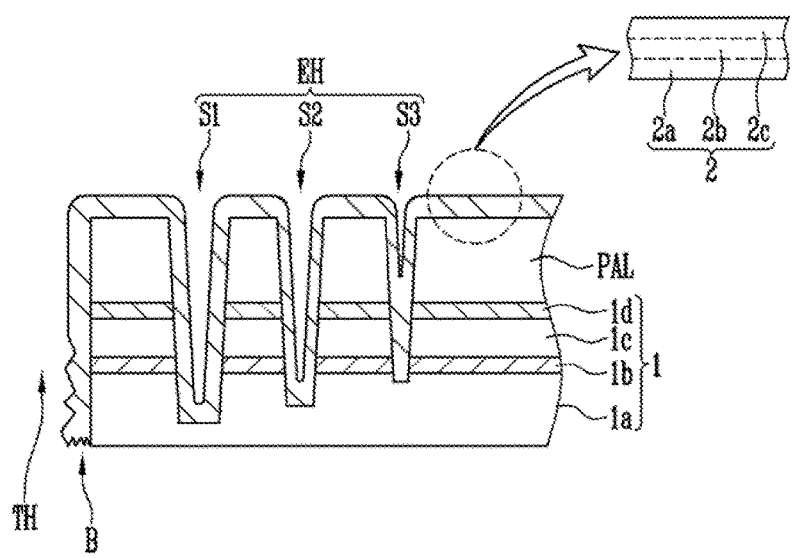
FIG. 5 is an enlarged cross-sectional view of part C of FIG. 4.

FIG. 5 is an enlarged cross-sectional view of part C of FIG. 4.

Referring to FIG. 5, the encapsulation groove EH may include a plurality of slits S1, S2 and S3 and the inner walls of the plurality of slits S1, S2 and S3 may each be at least partially covered with the encapsulation layer 2. The plurality of slits S1, S2 and S3 may be formed so that the width and depth of each respective slit increase as the distance from the display region DA increases. For example, the slit S1 relatively closest to the through hole TH may have a greater width and a greater depth than a slit (e.g., slit S3) further from the through hole TH than the first slit S1.

The encapsulation layer 2 may include a first inorganic encapsulation layer 2a, an organic encapsulation layer 2b and a second inorganic encapsulation layer 2c. The inner wall of the through hole TH may be in direct contact with the first inorganic encapsulation layer 2a. As an example, the organic encapsulation layer 2b may be disposed on the first inorganic encapsulation layer 2a and the second inorganic encapsulation layer 2c may be disposed on the organic encapsulation layer 2b.

Thus, the encapsulation groove EH including the plurality of slits (e.g., or holes) and the encapsulation layer 2 as described herein may buffer the impact of a force applied to the substrate 1 if the substrate 1 is separated from an underlying layer (e.g., another substrate). A process of separating the substrate 1 from an underlying layer is described, for example, with reference to FIG. 14 below. Thus, an occurrence of defects in the display area may be reduced or eliminated, and reliability and longevity of the display device may be increased.

FIGS. 6A, 6B, 6C and 6D are cross-sectional views illustrating a method of manufacturing a display device according to an exemplary embodiment of the present invention. FIGS. 6A to 6D are cross-sectional views taken along the line X1-X2 in FIG. 2.

Figure 6A:
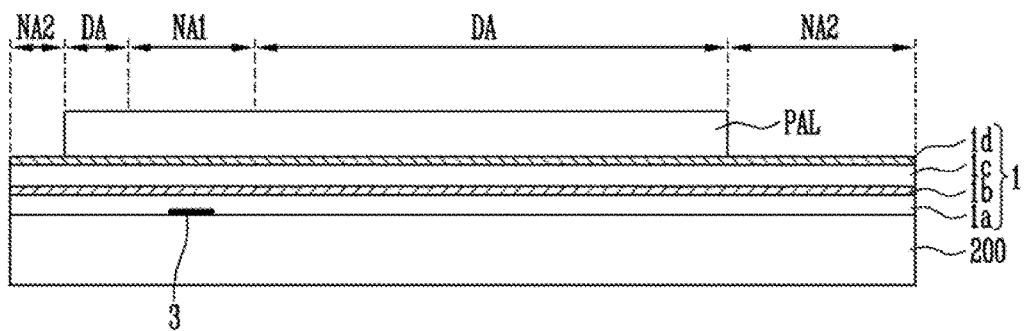
FIGS. 6A, 6B, 6C and 6D are cross-sectional views illustrating a method of manufacturing a display device according to an exemplary embodiment of the present invention.

Referring to FIG. 6A, a first substrate 200 may be provided. The first substrate 200 may include glass, quartz, or plastic. The first substrate 200 may be a supporting substrate.

An adhesive layer 3 may be formed on the first substrate 200 in an area corresponding to the through hole TH. The adhesive layer 3 may include amorphous silicon as an inorganic material. Thus, the adhesive layer 3 might be formed on a portion of the first substrate 200, but may be omitted on a portion of the substrate 200.

A second substrate 1 may be provided on the first substrate 200 including the adhesive layer 3. The second substrate 1 may include the display region DA, the first non-display region NA1 in the display region DA, and the second non-display region NA2 outside the display region DA.

The second substrate 1 may have a laminated structure including a first organic layer 1a, a first inorganic layer 1b, a second organic layer c and a second inorganic layer 1d.

The pixel array layer PAL may be formed on the display region DA of the second substrate 1.

Figure 6B:
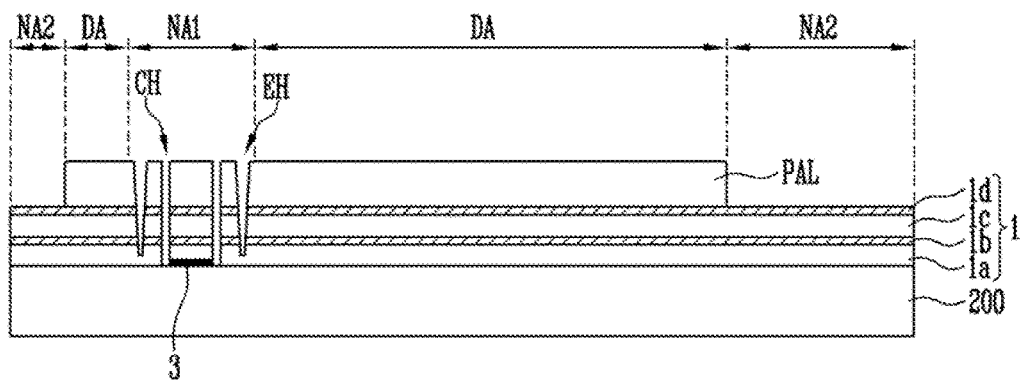

Referring to FIG. 6B, the separation hole CH and the encapsulation groove EH may be formed in the first non-display region NA1 of the second substrate 1. The encapsulation groove EH may be spaced apart from (e.g., may be formed outside) the separation hole CH. The separation hole CH may be formed to penetrate the pixel array layer PAL and the second substrate 1 and the encapsulation groove EH may be formed to a predetermined depth of the second substrate 1 through the pixel array layer PAL.

Figure 6C:
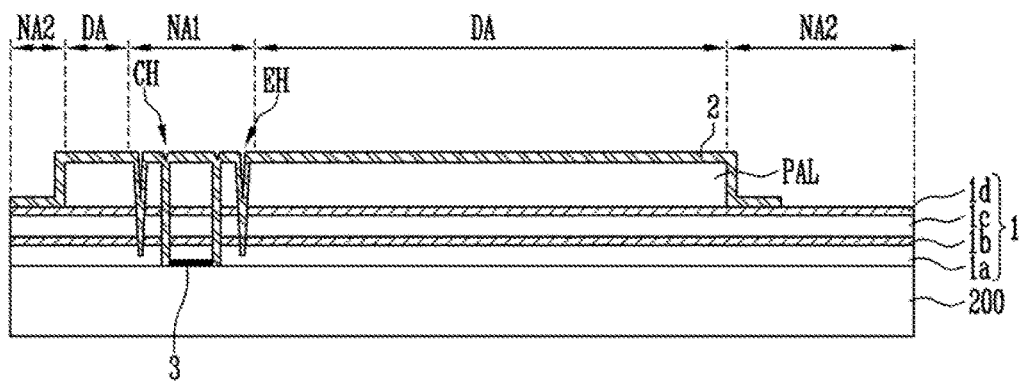

Referring to FIG. 6C, the encapsulation layer 2 may be formed on the display region DA and the first and second non-display regions NA1 and NA2 to at least partially cover the pixel array layer PAL. The encapsulation layer 2 may be formed to at least partially cover upper and side surfaces of the pixel array layer PAL. Referring to FIG. 5, the encapsulation layer 2 may include the first inorganic encapsulation layer 2a, the organic encapsulation layer 2b and the second inorganic encapsulation layer 2c.

The encapsulation layer 2 may be formed so that the inner walls of the separation hole CH and the encapsulation groove EH are at least partially covered. For example, in the inner walls of the separation hole CH and the encapsulation groove EH, the encapsulation layer 2 may be formed so that the first and second inorganic layers 1b and 1d of the second substrate 1 are in direct contact with the first inorganic encapsulation layer 2a of the encapsulation layer 2.

Figure 6D:
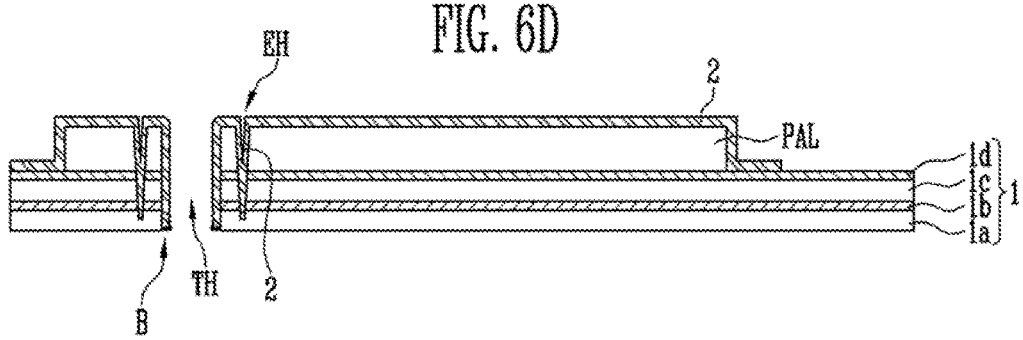

Referring to FIG. 6D, the first substrate 200 may be separated from the second substrate 1. In the step of separating the first substrate 200 from the second substrate 1, the pixel array layer PAL and the second substrate 1 inside the separation hole CH may be separated together with the first substrate 200. Thus, the through hole TH may be formed in the second substrate 1. The end face (e.g., end face B) of the encapsulation layer 2 on the inner wall of the separation hole CH may have an irregular (e.g., zigzag) shape when viewed from a side of the second substrate 1 opposite the pixel array layer. The irregular shape may be caused by cracks formed in the second substrate 1 when the first substrate 200 is separated from the second substrate 1.

When the second substrate 1 inside the separation hole CH is bonded to the first substrate 200 by the adhesive layer 3, the pixel array layer PAL and the second substrate 1 inside the separation hole CH may be relatively easily separated in a state of being attached to the first substrate 200.

When the inner wall of the separation hole CH is in direct contact with the first inorganic encapsulation layer 2a of the encapsulation layer 2, the first and/or second inorganic encapsulation layers 2a and/or 2c may be peeled off from the first substrate 200 while being cracked, and the end face (e.g., end face B) of the first and second inorganic encapsulation layers 2a and 2c on the inner wall of the separation hole CH may have the irregular shape.

A method of manufacturing a display device according to an exemplary embodiment of the present invention will be described in more detail below with reference to FIGS. 7 to 14.

FIGS. 7 to 14 are cross-sectional views illustrating a method of manufacturing a display device according to an exemplary embodiment of the present invention.

For clarity of description, a region where the through hole TH is to be formed, a region where the separation hole CH is to be formed, a region where the encapsulation groove EH is to be formed, and the display region DA where the pixels PX are to be formed are illustrated sequentially from the right side. However, the precise locations and spacing of the region where the through hole TH is to be formed, a region where the separation hole CH is to be formed, a region where the encapsulation groove EH is to be formed, and the display region DA where the pixels PX are to be formed are illustrated sequentially from the right side may vary from the illustrated locations and spacing. The separation hole CH may partially include a peripheral portion of the through hole TH. The region where the through hole TH is to be formed, the region where the separation hole CH is to be formed, and the region where the encapsulation groove EH is to be formed may be arranged in the first non-display region NA1.

Figure 7:
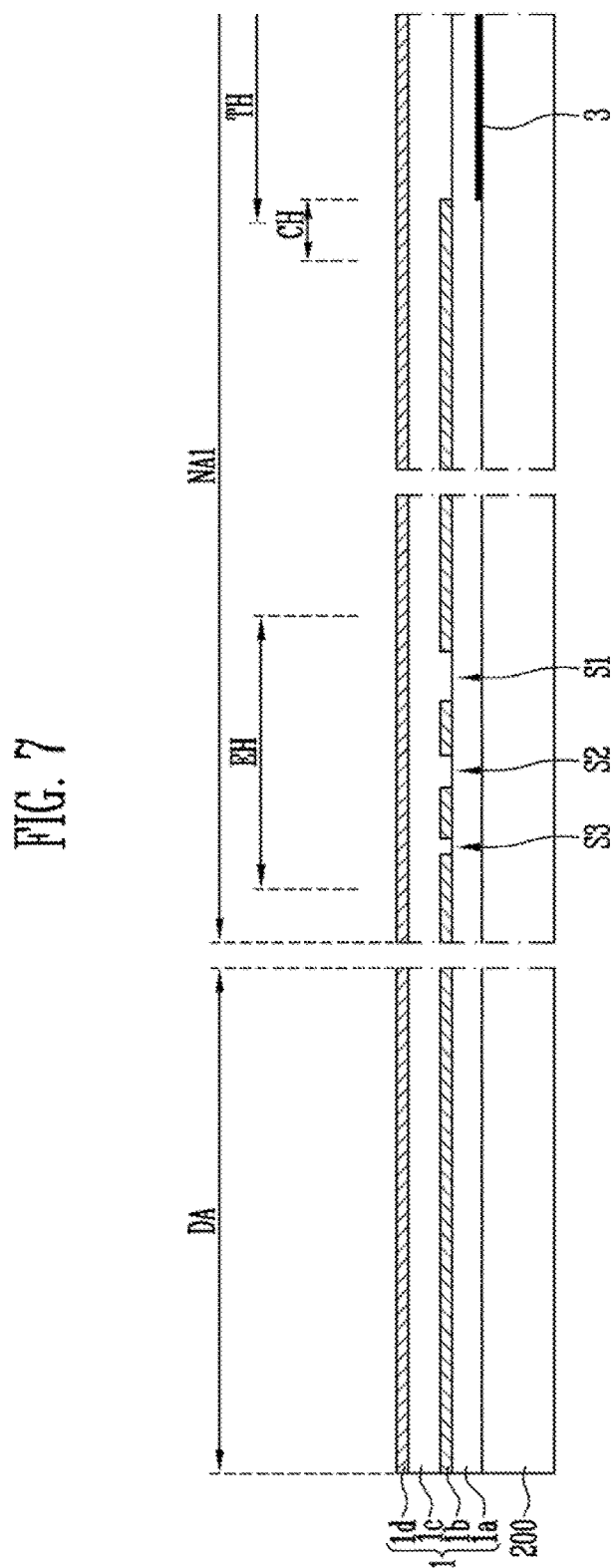
FIGS. 7 to 14 are cross-sectional views illustrating a method of manufacturing a display device according to an exemplary embodiment of the present invention.

Referring to FIG. 7, the first substrate 200 may be a supporting substrate. The first substrate 200 may include glass, quartz, metal, or plastic.

The adhesive layer 3 may be formed on a portion of the first substrate 200 in the region where the through hole TH is to be formed (e.g., immediately adjacent to a region where the through hole TH is to be formed. The adhesive layer 3 may include amorphous silicon as an inorganic material.

The second substrate 1 may be formed on the first substrate 200.

The first organic layer 1a and the first inorganic layer 1b may be sequentially formed on substantially the entire upper surface of the first substrate 200 including the adhesive layer 3, and then the first inorganic layer 1b may be patterned. The first inorganic layer 1b in the region where the through hole TH is to be formed inside the region where the separation hole CH is to be formed may be substantially completely removed and the first inorganic layer 1b in the region where the encapsulation groove EH is to be formed may be patterned to have a plurality of slits S1, S2, and S3. The size (e.g., width) of the plurality of slits S1, S2, and S3 may increase as the distance from the display region DA increases.

While the plurality of slits S1, S2, and S3 may have different sizes (e.g., widths) from each other as described herein, exemplary embodiments of the present invention are not limited thereto. For example, the sizes (e.g., widths) of the plurality of slits S1, S2, and S3 may be substantially the same as each other. While three slits S1, S2 and S3 may be formed, the number of slits may be modified, as desired. For example, four or more slits may be formed.

The first inorganic layer 1b may be patterned by dry etching or etching using a laser. By adjusting the energy density of the laser beam, the size (e.g., width) of the plurality of slits S1, S2, and S3 may be adjusted.

The first organic layer 1a may include at least one of polyethersulphone (PES), polyacrylate (PAR), polyether imide (PEI), polyethylene naphthalate (PEN), polyethylene terephthalate (PET), polyphenylene sulfide (PPS), polyallylate, or polyimide. However, exemplary embodiments of the present invention are not limited thereto.

The first inorganic layer 1b may be a barrier layer, which may block the penetration of foreign matter, moisture or outside air.

The second organic layer 1c and the second inorganic layer 1d may be sequentially formed on the first inorganic layer 1b.

The second organic layer 1c may include a same material as the first organic layer 1a or one of the organic materials described above. The second inorganic layer 1d may be a buffer layer, which may block the penetration of foreign matter, moisture or outside air. The second inorganic layer 1d may flatten an upper surface of the second substrate 1 opposite the first substrate 200. The second inorganic layer 1d may be a single layer, but exemplary embodiments of the present invention are not limited thereto. The second inorganic layer d may be formed in multiple layers.

The first organic layer 1a, the first inorganic layer 1b, the second organic layer 1c and the second inorganic layer 1d may form the second substrate 1 of the display device 300.

Figure 8:
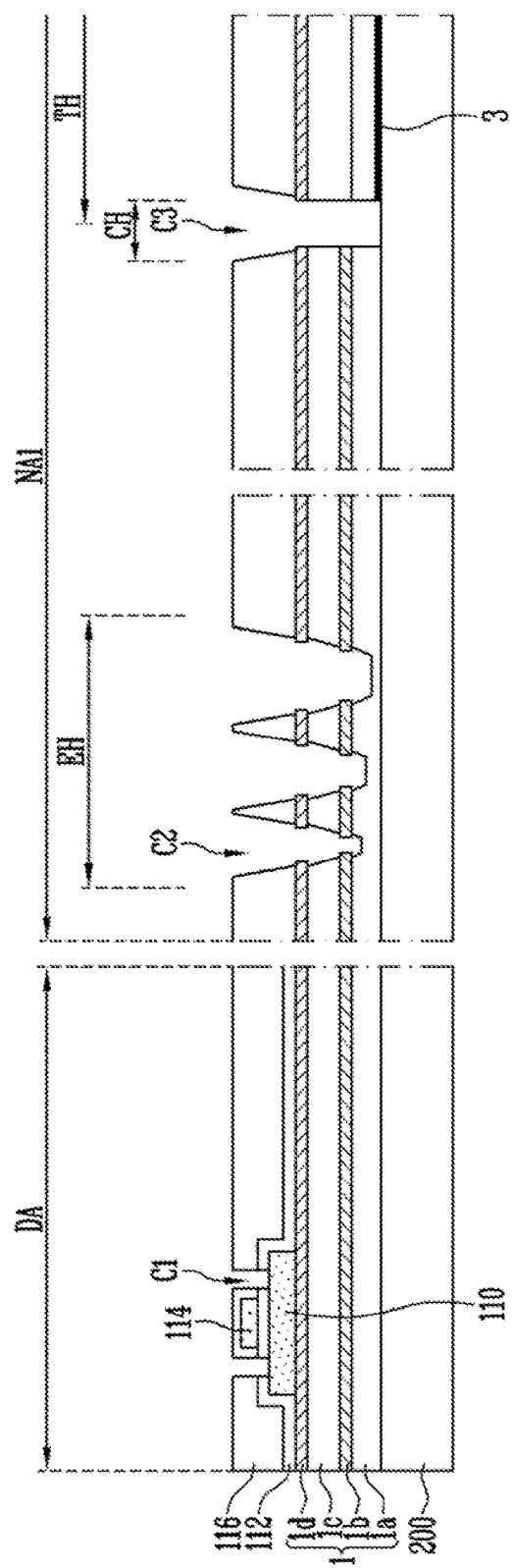

Referring to FIG. 8, a semiconductor layer 110 may be formed on the second substrate 1 of the display region DA and a gate insulating layer 112 may be formed on the second substrate 1 including the semiconductor layer 110.

The semiconductor layer 110 may include a source region, a drain region, and a channel region between the source region and the drain region.

A gate electrode 114 may be formed on the gate insulating layer 112. The gate electrode 114 may overlap the channel region of the semiconductor layer 110 and a third organic layer 116 as an interlayer insulating layer is formed on the gate insulating layer 112 including the gate electrode 114. The third organic layer 116 may be formed on substantially an entire upper surface of the second substrate 1 including the display region DA and the first and second non-display region NA1 and NA2.

The third organic layer 116 may be patterned. Holes C1 may be formed in the third organic layer 116 of the display region DA, which may expose the source and drain regions of the semiconductor layer 110. Holes C2 corresponding to the slits S1, S2, and S3 may be formed in the region of the third organic layer 116 where the encapsulation groove EH is to be formed. Holes C3 may be formed in the region of the third organic layer 116 where the separation hole CH is to be formed.

The second inorganic layer 1d, the second organic layer 1c, and the first organic layer 1a which are exposed through the holes C2 and C3 may be sequentially removed.

The second inorganic layer 1d may be patterned to correspond to the first inorganic layer 1b.

In the region where the encapsulation groove EH is to be formed, the depth at which the first organic layer 1a is removed may be varied according to the width of the slits S1, S2, and S3. For example, when the first organic layer 1a is etched by dry etching having isotropic etching characteristics, the depth of the slits S1, S2, and S3 may be increased according to the width of the slits S1, S2, and S3. The depth of the slits S1, S2, and S3 may be increased as the distance from the display region DA increases.

The second organic layer 1c and the first organic layer 1a may be continuously removed by, for example, dry etching using oxygen ($O_2$) gas or dry etching using a laser.

Figure 9:
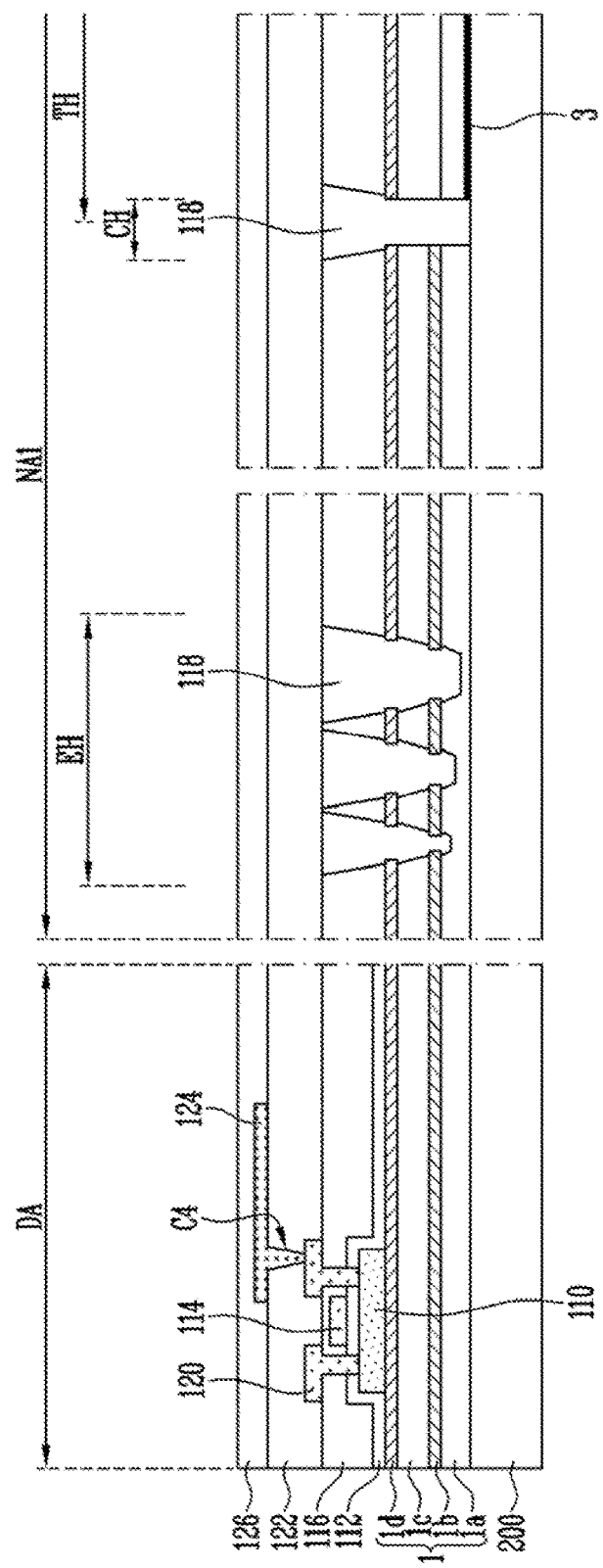

Referring to FIG. 9, a fourth organic layer 118 may be buried in an empty space exposed through the holes C2 and C3 and the surface of the fourth organic layer 118 may be planarized.

Source and drain electrodes 120 may be formed on the third organic layer 116 to be connected to the source and drain regions of the semiconductor layer 110 through the holes C1 of the display area DA.

A fifth organic layer 122 may be formed as a planarization layer on the third organic layer 116 and the fourth organic layer 118 including the source and drain electrodes 120 and a hole C4 may be formed in the fifth organic layer 122 so that the source or drain electrode 120 is exposed.

The fifth organic layer 122 may be a general polymer such as polymethylmethacrylate (PMMA) or polystyrene (PS), a polymer derivative having a phenol group, an acrylic polymer, an imide polymer, an arylether polymer, an amide-based polymer, a fluorine-based polymer, a p-xylene-based polymer, or a vinyl alcohol-based polymer; however, exemplary embodiments of the present invention are not limited thereto.

A first electrode 124 may be formed on the fifth organic layer 122 as an anode. The first electrode 124 may be connected to the source or drain electrode 120 through the hole C4.

The first electrode 124 may include a reflective layer including Ag, Mg, Al, Pt, Pd, Au, Ni, Nd, Ir, Cr, or a compound thereof and a transparent or semitransparent conductive layer formed on the reflective layer. The transparent or semitransparent conductive layer may include at least one of indium tin oxide (ITO), indium zinc oxide (IZO), zinc oxide (ZnO), indium oxide ($In_2O_3$), indium gallium oxide (IGO), or aluminum zinc oxide (AZO).

A sixth organic layer 126 may be formed as a pixel defining layer on the fifth organic layer 122 of the display region DA including the first electrode 124 and the first and second non-display regions NA1 and NA2.

The sixth organic layer 126 may include at least one of polyimide, polyamide, acrylic resin, benzocyclobutene, or phenol resin.

Figure 10:
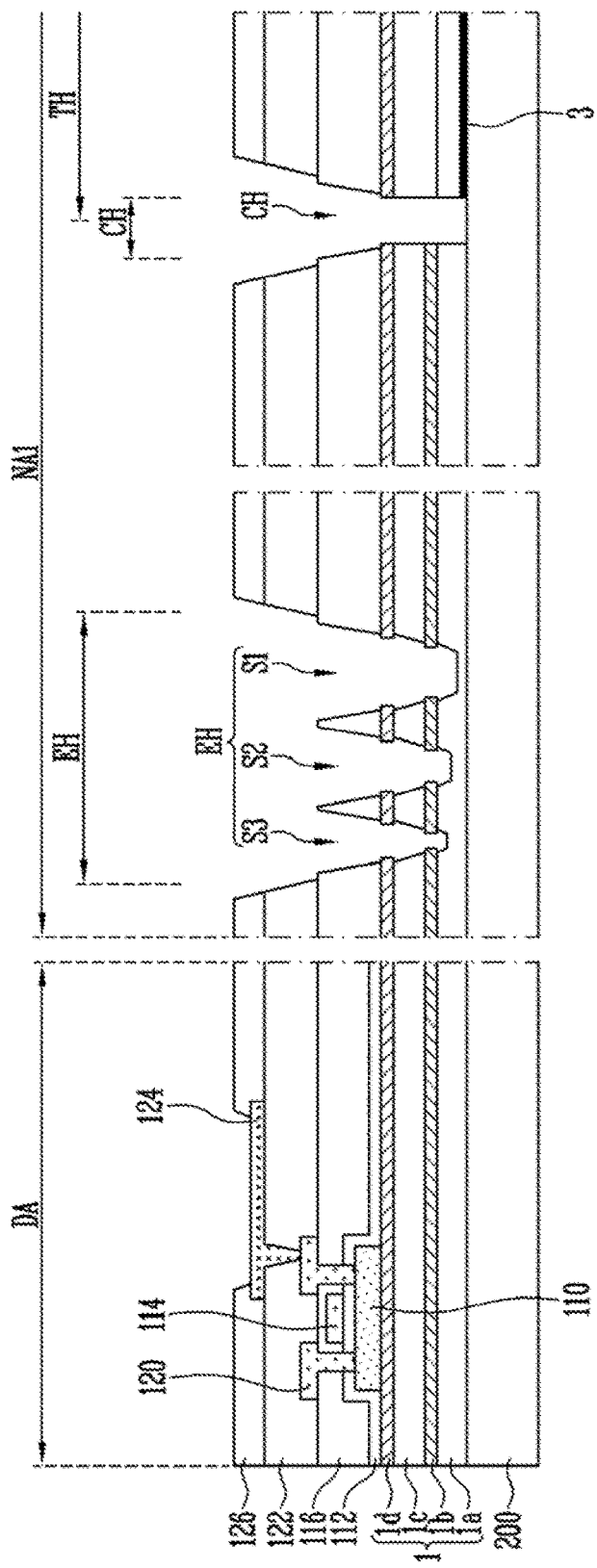

Referring to FIG. 10, the sixth organic layer 126 may be patterned to form an opening to expose a predetermined portion of the first electrode 124. The sixth organic layer 126, the fifth organic layer 122, and the fourth organic layer 118 may be sequentially removed to define the region where the encapsulation groove EH and the separation hole CH are to be formed. Thus, the encapsulation groove EH may be formed so that the first organic layer 1a is exposed through the slits S1, S2 and S3, and the separation hole CH is formed so that the first substrate 200 is exposed.

At least one spacer may then be formed on the sixth organic layer 126 outside the opening.

Figure 11:
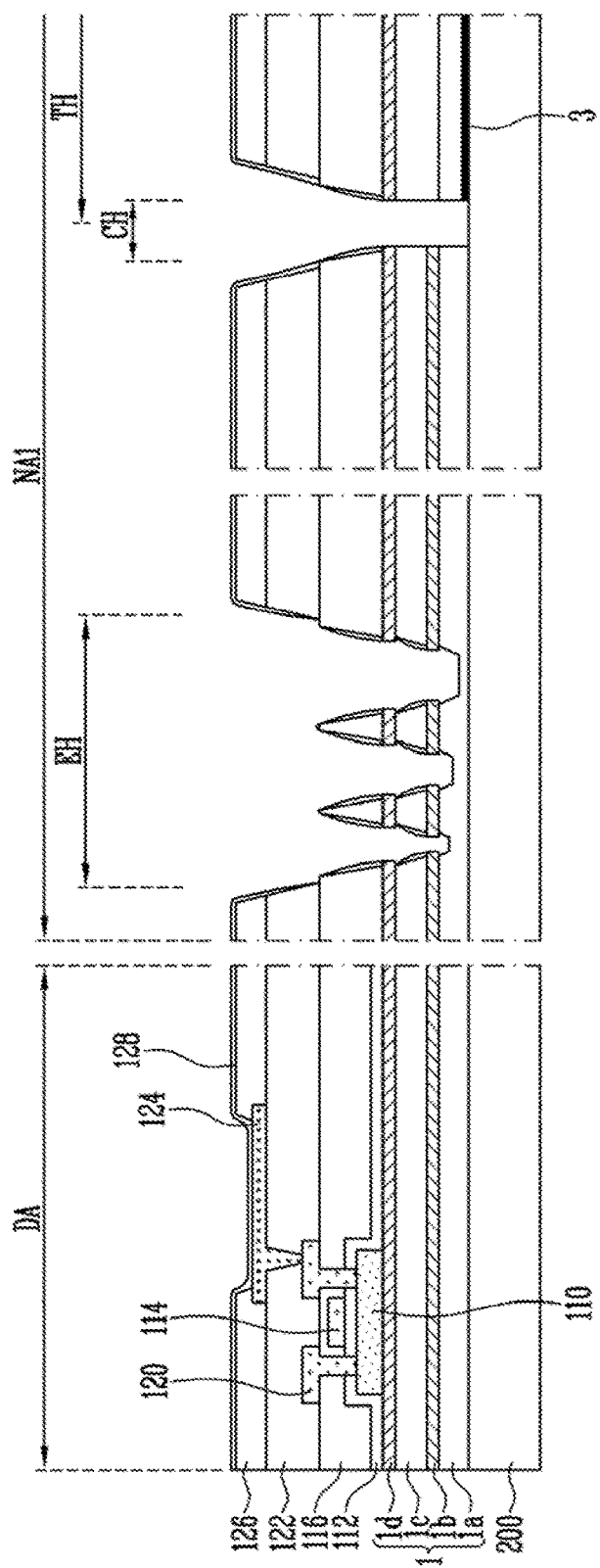

Referring to FIG. 11, an organic light emitting layer 128 may be formed on the first electrode 124 exposed through the opening of the sixth organic layer 126.

The organic light emitting layer 128 may include a hole injection layer, a hole transport layer, an electron transport layer, and an electron injection layer, and may further include an auxiliary layer or an intermediate layer.

At least one layer of the organic light emitting layer 128 may be formed as a common layer on substantially the entire upper surface of the display region DA and the first non-display region NA1. Since the side walls of the encapsulation groove EH and the separation hole CH have stepped portions, the organic light-emitting layer 128 may have relatively poor step coverage. Therefore, the organic light emitting layer 128 may be broken at the stepped portions due to the step difference. This may prevent the deterioration of the electrical characteristics of the organic light emitting layer 128 due to an undesired connection, and the inorganic layers 1b and 1d of the second substrate 1 may be exposed from the side walls of the encapsulation groove EH and the separation hole CH.

Figure 12:
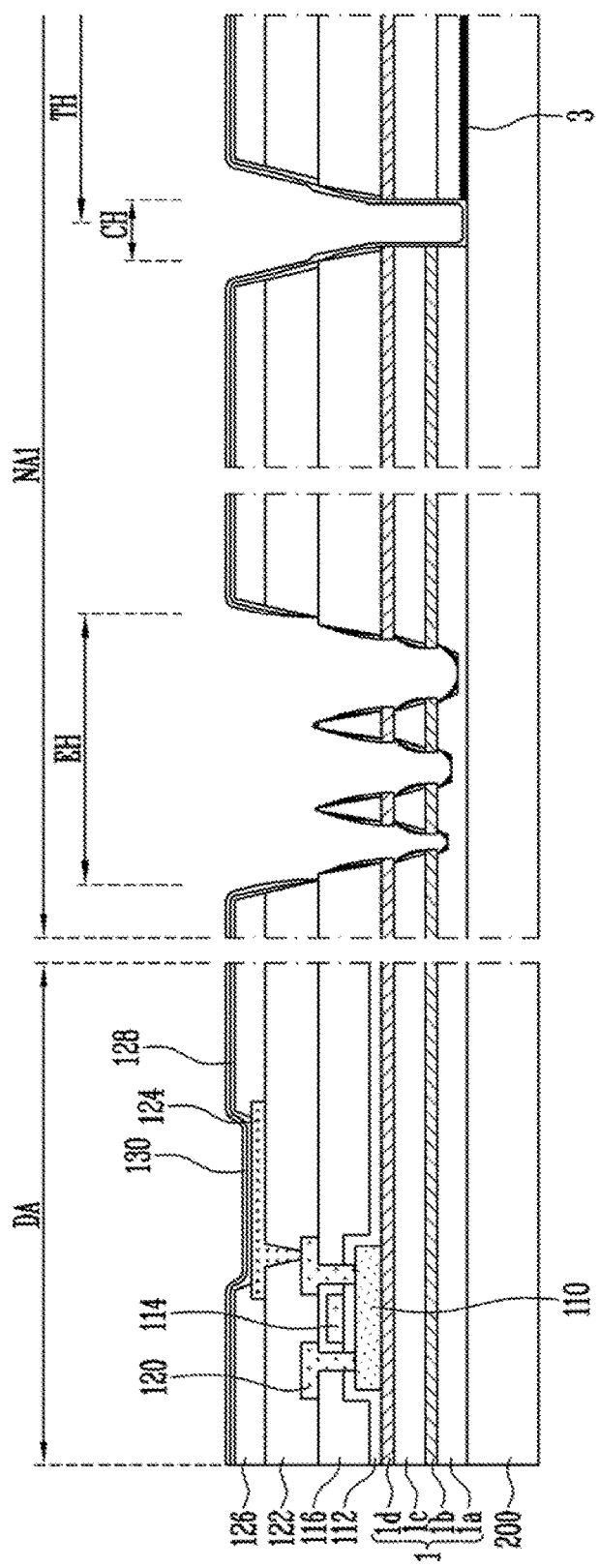

Referring to FIG. 12, a second electrode 130 may be formed as a cathode on the organic light emitting layer 128. When the side walls of the encapsulation groove EH and the separation hole CH have stepped portions, the step coverage of the second electrode 130 is also poor. Therefore, the second electrode 130 may be broken at the stepped portions due to the step difference. This may prevent the deterioration of the electrical characteristics of the second electrode 130 due to an undesired connection, and the inorganic layers 1b and 1d of the second substrate 1 may be exposed from the side walls of the encapsulation groove EH and the separation hole CH.

The second electrode 130 may be a transparent or semi-transparent electrode and may include a metal having a relatively low work function. The metal may include one of Li, Ca, LiF/Ca, LiF/Al, Al, Ag, Mg or a compound thereof.

Figure 13:
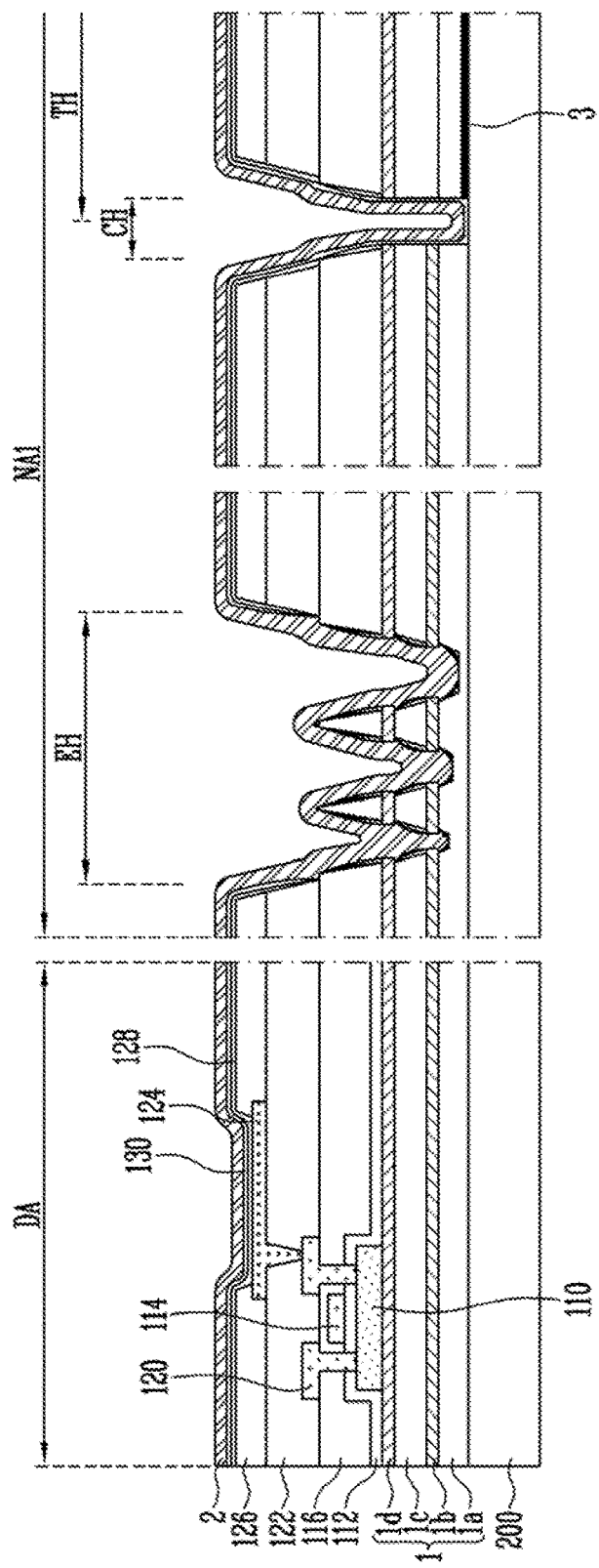

Referring to FIG. 13, the encapsulation layer 2 may be formed on substantially the entire upper surface of the display region DA and the first and second non-display regions NA1 and NA2. The encapsulation layer 2 may have a laminated structure including at least one organic layer and at least one inorganic layer. The organic layer and the inorganic layer may be alternately laminated. As an example, the organic layers and the inorganic layers may be alternately and repeatedly stacked. For example, the upper-most layer may be an inorganic layer, which may prevent a penetration of moisture or outside air, and the inorganic layer may substantially cover the outer periphery of the organic layer.

For example, referring to FIG. 5, the encapsulation layer 2 may include the first inorganic encapsulation layer 2a, the organic encapsulation layer 2b, and the second inorganic encapsulation layer 2c.

The first and second inorganic encapsulation layers 2a and 2c may include at least one material selected from silicon nitride, aluminum nitride, zirconium nitride, titanium nitride, hafnium nitride, tantalum nitride, silicon oxide, aluminum oxide, titanium oxide, tin oxide, or cerium oxide and silicon oxynitride (SiON).

The organic encapsulation layer 2b may flatten the surface and relieve the stress generated in the first and second inorganic encapsulation layers 2a and 2c. The organic encapsulation layer 2b may include polymethylmethacrylate (PMMA), polycarbonate (PC), polystyrene (PS), acrylic resin, epoxy resin, polyimide, or polyethylene.

When the organic encapsulation layer 2b is formed on the side walls of the encapsulation groove EH and the separation hole CH due to the step difference of the side wall, the side walls of the encapsulation groove EH and the separation hole CH may be substantially covered with the first inorganic encapsulation layer 2a and the second inorganic encapsulation layer 2c. For example, the first inorganic encapsulation layer 2a may be in direct contact with the side walls of the encapsulation groove EH and the separation hole CH, the organic encapsulation layer 2b may be disposed on the first inorganic encapsulation layer 2a and the second inorganic encapsulation layer 2c may be disposed on the organic encapsulation layer.

As an example, in the encapsulation groove EH, the first inorganic encapsulation layer 2a may be in direct contact with the exposed first inorganic layer 1b and the exposed second inorganic layer 1d of the second substrate 1, and thus encapsulation properties of the encapsulation layer 2 may be increased (e.g., prevention of a penetration of moisture or impurities may be increased).

According to an exemplary embodiment of the present invention, a display device may include the first substrate 200 and the second substrate 1 including an organic layer and an inorganic layer (e.g., 1a, 1b, 1c and 1d) disposed on the first substrate 200. The encapsulation groove EH may be formed in the second substrate 1. The encapsulation groove EH may include a plurality of holes (e.g., holes C2 described with reference to FIG. 8 or slits S1, S2 and S3 described with reference to FIG. 5) formed in the second substrate 1. The through hole TH may penetrate the second substrate 1. The through hole TH may have a greater depth than a depth of the encapsulation groove EH toward the first substrate 200. The through hole TH may be spaced apart from the encapsulation groove EH. The encapsulation layer 2 may be formed on an inner sidewall of the encapsulation groove EH and on an inner sidewall of the through hole TH.

According to an exemplary embodiment of the present invention, a lowermost level of the through hole TH may be aligned with an upper surface of the first substrate 200 facing the second substrate 1.

According to an exemplary embodiment of the present invention, the adhesive layer 3 may be immediately adjacent to the through hole TH. The adhesive layer 3 may be spaced apart from the encapsulation groove Eli. The adhesive layer 3 may be disposed between the first substrate 200 and the second substrate 1.

Figure 14:
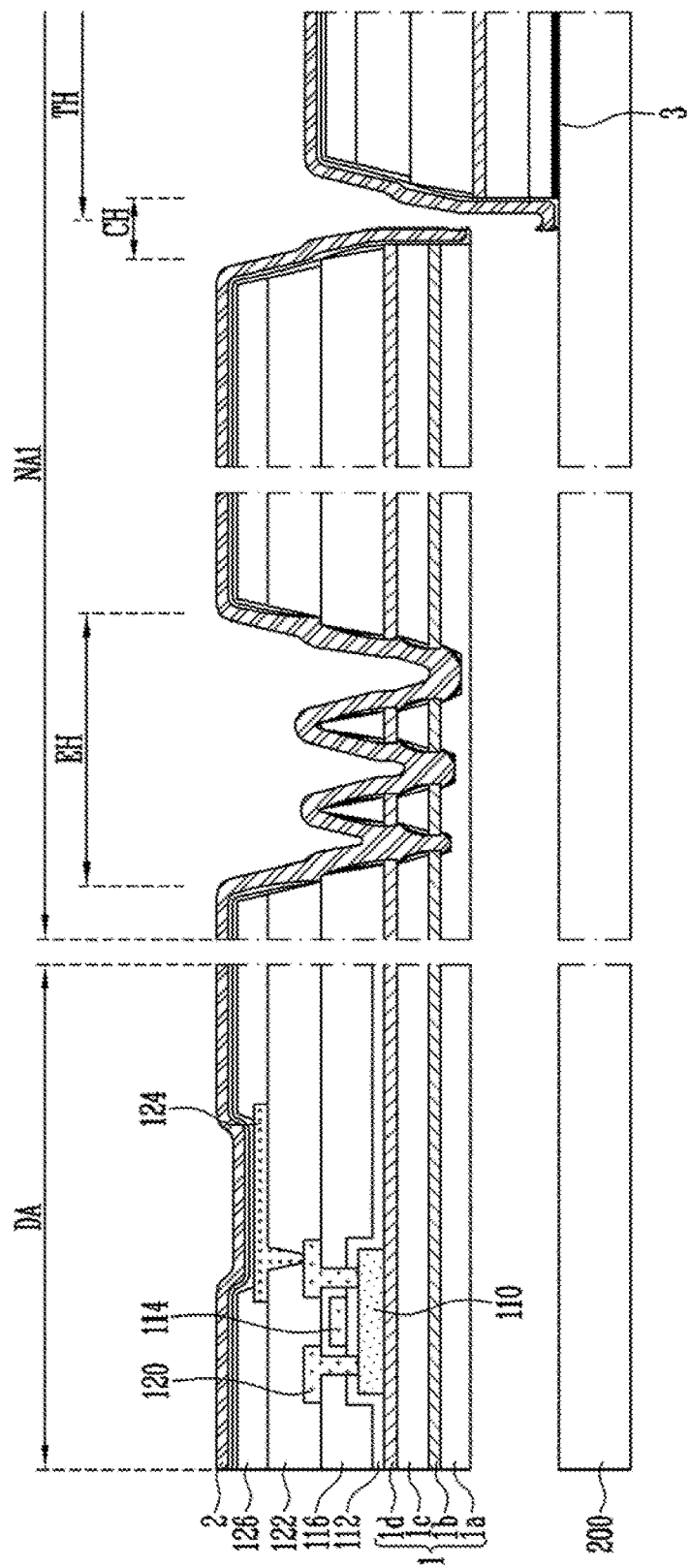

Referring FIG. 14, the first substrate 200 may be separated from the second substrate 1.

For example, the first substrate 200 may be separated from a back surface of the first substrate 200 by irradiating a laser beam.

In the step of separating the first substrate 200, a predetermined impact or force may be provided to the first substrate 200. The first substrate 200 may be separated from the second substrate 1 while the encapsulation layer 2 having a relatively small thickness is cracked by the impact or force. When the second substrate 1 is attached to the first substrate 200 with a relatively strong adhesive force by the adhesive layer 3, the layers 116, 122, and 126 formed on the second substrate 1 may also be separated with the first substrate 200, and thus the through hole TH may be formed in the second substrate 1. Thus, the through hole TH may be a remaining hole formed after the first substrate 200 is separated from the second substrate 1. The end face of the encapsulation layer 2 on the inner wall of the separation hole CH may have an irregular (e.g., zigzag) shape due to cracks formed when the first substrate 200 is separated from the second substrate 1. The irregular shape of the encapsulation layer 2 may face in a downward direction away from the pixel array layer PAL. Alternatively, the irregular shape of the encapsulation layer 2 may face toward an inside of the separation hole TH along a direction parallel to an upper surface of the substrate 1.

If the encapsulation groove EH is adjacent to the separation hole CH, the encapsulation layer 2 in the encapsulation groove EH may be cracked in the process of cracking the encapsulation layer 2 in the separation hole CH. Thus, the encapsulation groove EH may be spaced apart from the separation hole CH.

As described above, an exemplary embodiment of the present invention uses a separation hole to form a through hole in a display device. The inner wall of the separation hole may be substantially covered with an inorganic encapsulation layer and cracks may be generated in the inorganic encapsulation layer due to the impact or force caused by the separation of a support substrate. The through hole may be formed by removing the layers formed on a substrate inside the separation hole together with the supporting substrate.

In the case that a through hole is formed using a laser beam, the dead space may be increased by the width (e.g., several hundreds of micrometers) of the laser beam. However, according to an exemplary embodiment of the present invention, an increase in the dead space may be prevented since the separation hole may be formed with a width of several micrometers to several tens of micrometers by photolithography and etching.

In an exemplary embodiment of the present invention, an encapsulation groove may be spaced apart from the separation hole, and the inner wall of the encapsulation groove may be substantially covered with the inorganic encapsulation layer. The inorganic encapsulation layer may directly contact the inorganic layers of the inner wall of the encapsulation groove.

Further, in an exemplary embodiment of the present invention, a plurality of slits may be formed in the encapsulation groove, and the width and depth of the plurality of slits may be increased as the distance from the display region increases. The plurality of slits at least partially filled with the inorganic encapsulation layer may act as a plurality of blocking walls, and the height of the blocking wall may be increased as it is closer to the through hole.

Since the through hole is located in the display region, the display region may be vulnerable to penetration of moisture or outside air. However, according to an exemplary embodiment of the present invention, the encapsulation effect may be increased by bonding the inorganic encapsulation layers and the inorganic layers in the encapsulation groove and the penetration of moisture or outside air into the display region may be reduced or prevented by providing the plurality of blocking walls.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
   a substrate including a display region, a first non-display region in the display region and a second non-display region outside the display region;
   a pixel array layer disposed on the display region of the substrate; and
   an encapsulation layer disposed on the display region, wherein the encapsulation layer is disposed on the first and second non-display regions of the substrate,
   wherein the first non-display region includes a through hole penetrating the pixel array layer and the substrate; and
   an encapsulation groove spaced apart from the through hole,
   wherein an inner wall of the through hole and an inner wall of the encapsulation groove are each at least partially covered with the encapsulation layer, and
   an end face of the encapsulation layer facing away from the pixel array layer has an irregular shape when viewed from a side of the substrate opposite the pixel array layer.

2. The display device of claim 1, wherein the substrate is a flexible substrate.

3. The display device of claim 1, wherein the pixel array layer includes a pixel array in which a plurality of pixels are connected between a plurality of scan lines and a plurality of data lines, and each of the plurality of pixels includes a light emitting element and at least one transistor.

4. The display device of claim 1, wherein the encapsulation groove includes a plurality of slits and inner walls of each of the plurality of slits are at least partially covered with the encapsulation layer.

5. The display device of claim 4, wherein widths and depths of the plurality of slits are increased as a distance from the display region increases.

6. The display device of claim 1, wherein the encapsulation layer includes a first inorganic encapsulation layer, an organic encapsulation layer and a second inorganic encapsulation layer, and
   wherein the inner wall of the through hole is in direct contact with the first inorganic encapsulation layer.

7. The display device of claim 1, wherein the irregular shape includes a zigzag pattern.

8. A method of manufacturing a display device, the method comprising:
   providing a first substrate;
   providing a second substrate on the first substrate, the second substrate including a display region, a first non-display region in the display region and a second non-display region outside the display region;
   forming a pixel array layer on the display region of the second substrate;

forming a separation hole and an encapsulation groove in the first non-display region of the second substrate;

forming an encapsulation layer on the display region and the first and second non-display regions of the second substrate, wherein an inner wall of the separation hole and an inner wall of the encapsulation groove are at least partially covered with the encapsulation layer; and separating the first substrate from the second substrate;

wherein in the separating of the first substrate from the second substrate, the pixel array layer and the second substrate inside the separation hole are separated together with the first substrate, and a remaining through hole is formed in the second substrate, and an end face of the encapsulation layer formed on the inner wall of the separation hole when the first substrate is separated from the second substrate has an irregular shape.

9. The method of claim 8, wherein the first substrate includes glass, quartz, metal or plastic.

10. The method of claim 8, wherein the second substrate is a flexible substrate.

11. The method of claim 8, wherein the second substrate includes a first organic layer, a first inorganic layer, a second organic layer and a second inorganic layer, and the encapsulation layer is formed to contact with the first and second inorganic layers on the inner wall of the separation hole and the inner wall of the encapsulation groove.

12. The method of claim 8, wherein the encapsulation groove is spaced apart from the separation hole.

13. The method of claim 8, wherein the encapsulation groove is formed to include a plurality of slits, and the encapsulation layer is formed to at least partially cover inner walls of the plurality of slits.

14. The method of claim 13, wherein the plurality of slits is formed so that widths and depths of each of the plurality of slits increase as a distance from the display region increases.

15. The method of claim 8, wherein in the forming of the separation hole and the encapsulation groove, the separation hole is formed to penetrate the pixel array layer and the second substrate, and the encapsulation groove is formed to a predetermined depth of the second substrate through the pixel array layer.

16. The method of claim 8, further comprising:

forming an adhesive layer on the second substrate in an area corresponding to the through hole.

17. A display device, comprising:

a first substrate;

a second substrate comprising an organic layer and an inorganic layer disposed on the first substrate;

an encapsulation groove formed in the second substrate, wherein the encapsulation groove comprises a plurality of holes formed in the second substrate;

a through hole penetrating the second substrate, wherein the through hole has a greater depth than a depth of the encapsulation groove toward the first substrate, and wherein the through hole is spaced apart from the encapsulation groove; and an encapsulation layer formed on an inner sidewall of the encapsulation groove and on an inner sidewall of the through hole.

18. The display device of claim 17, wherein a lowermost level of the through hole is aligned with an upper surface of the first substrate facing the second substrate.

19. The display device of claim 17, further comprising an adhesive layer immediately adjacent to the through hole, wherein the adhesive layer is spaced apart from the encapsulation groove, and wherein the adhesive layer is disposed between the first substrate and the second substrate.

20. The display device of claim 17, wherein the encapsulation layer comprises at least one organic layer and at least one inorganic layer.

* * * * *